(12) United States Patent
Meijer et al.

(10) Patent No.: US 6,309,801 B1
(45) Date of Patent: Oct. 30, 2001

(54) METHOD OF MANUFACTURING AN ELECTRONIC DEVICE COMPRISING TWO LAYERS OF ORGANIC-CONTAINING MATERIAL

(75) Inventors: Petrus M. Meijer, Eindhoven; Bartholome S. Manders, Nijmegen, both of (NL)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/325,673

(22) Filed: Jun. 3, 1999

(30) Foreign Application Priority Data

Nov. 18, 1998  (EP) .................................................. 98203879

(51) Int. Cl.$^7$ ....................................................... G03F 7/00
(52) U.S. Cl. ........................... 430/313; 430/316; 430/317
(58) Field of Search .................................. 430/311, 316, 430/313, 314, 317

(56) References Cited

U.S. PATENT DOCUMENTS

| | | | |
|---|---|---|---|
| 4,836,885 | * | 6/1989 | Breiten et al. ........................ 156/643 |
| 5,329,152 | * | 7/1994 | Janai et al. ............................ 257/529 |
| 5,625,637 | * | 4/1997 | Mori et al. .............................. 372/96 |
| 5,930,594 | * | 7/1999 | Vilain ..................................... 438/52 |
| 5,949,119 | * | 9/1999 | Vilain ................................... 257/420 |
| 5,949,507 | * | 9/1999 | Shimada et al. ...................... 349/113 |

FOREIGN PATENT DOCUMENTS

0680085 A1   11/1995   (EP) .
2326765 A    12/1998   (GB) .

* cited by examiner

*Primary Examiner*—Kathleen Duda
(74) *Attorney, Agent, or Firm*—Steven R. Biren (57) ABSTRACT

A method of manufacturing an electronic device with two layers of organic-containing material which enables a structure with well-defined dimensions to be made in the layers of organic-containing material. This is accomplished through a series of steps of applying a first layer of organic-containing material to a substrate, covering the it with a first layer of inorganic material, applying a second distinct layer of inorganic material, providing a first mask layer of resist having first openings, and etching through the second layer of inorganic material at the first openings using an etch process where the second inorganic material is selectively etched with respect to the first inorganic material. The first mask layer of resist is removed, and etching is performed through the first layer of inorganic material at the location of the first openings. A second layer of organic-containing material is applied and is covered with a third layer of inorganic material. A fourth layer of distinct inorganic material is applied, and a second mask layer of resist having second openings is provided. Etching takes place through the fourth layer of inorganic material at the second openings using an etch process where the fourth inorganic material is selectively etched with respect to the third inorganic material. The second mask layer of resist is removed, and etching through the third layer of inorganic material at the second openings takes place.

13 Claims, 6 Drawing Sheets

METHOD OF MANUFACTURING AN ELECTRONIC DEVICE COMPRISING TWO LAYERS OF ORGANIC-CONTAINING MATERIAL

BACKGROUND OF THE INVENTION

The invention relates to a method of manufacturing an electronic device comprising two layers of organic-containing material, said method comprising the steps of:

applying a first layer of organic-containing material to a substrate, covering the first layer of organic-containing material with a first layer of inorganic material, applying a second layer of inorganic material which is different from the inorganic material of the first layer, providing a first mask layer of resist having first openings, etching through the second layer of inorganic material at the location of the first openings, etching through the first layer of inorganic material at the location of the first openings, applying a second layer of organic-containing material, covering the second layer of organic-containing material with a third layer of inorganic material, applying a fourth layer of inorganic material which is different from the inorganic material of the third layer, providing a second mask layer of resist having second openings, etching through the fourth layer of inorganic material at the location of the second openings, etching through the third layer of inorganic material at the location of the second openings, etching through the second layer of organic-containing material at the location of the second openings.

Such a method is known from EP-A-0 680 085. In one embodiment of the known method, an electrical connection is made between conductors on three metallisation levels in a semiconductor device, the connection being made through two layers of organic-containing dielectric material, each separating two adjacent metallisation levels. A first conductive layer is deposited on an insulating layer and subsequently patterned, whereby conductors on a first metallisation level are formed. Then an inorganic substrate encapsulation layer is deposited conformally on the exposed surfaces of the insulating layer and the conductors on the first metallisation level. Subsequently a first layer of organic-containing dielectric material, for example parylene, is deposited on and between the conductors on the first metallisation level. The first layer of organic-containing dielectric material is provided with an inorganic cap layer, for example silicon oxide, which in turn is covered with an inorganic hard mask layer, for example silicon nitride. After providing a mask layer of resist having openings, a via is etched through the inorganic hard mask layer, the inorganic cap layer and the first layer of organic-containing dielectric material at the location of the openings. Subsequently, an inorganic via passivation layer is applied to cover the exposed surfaces of the inorganic substrate encapsulation layer, the first layer of organic-containing dielectric material, the inorganic cap layer and the inorganic hard mask layer. In order to contact the underlying conductor on the first metallisation level, the inorganic via passivation layer is removed from the bottom of the via by anisotropic etching. During this step, the inorganic via passivation layer is removed from the top of the inorganic hard mask layer as well. The inorganic hard mask layer is applied in order to prevent etching of the inorganic cap layer during anisotropic etching. Next, a second conductive layer is applied to fill the via so as to form an electrical connection with the conductor on the first metallisation level at the bottom of the via. The part of the second conductive layer overlying the via is subsequently patterned, thereby forming conductors on a second metallisation level. Starting with the conformal deposition of a further inorganic substrate encapsulation layer and the application of a second layer of organic-containing dielectric material, the sequence of the above process steps is repeated once in order to finally end up with an electrical connection between the conductor on the first metallisation level, the conductor on the second metallisation level and a conductor on a third metallisation level, the connection being made through the first and the second layer of organic-containing dielectric material by means of vias filled with the conductive material.

A disadvantage of the known method is that it is difficult to control the dimensions of the vias.

SUMMARY OF THE INVENTION

It is an object of the invention to provide a method of manufacturing an electronic device comprising two layers of organic-containing material, which enables a structure with well-defined dimensions to be made in the layers of organic-containing material.

For this purpose, according to the invention, the method mentioned in the opening paragraph is characterized in that the second layer of inorganic material is etched in an etch process wherein the second inorganic material is selectively etched with respect to the first inorganic material, the first mask layer of resist is removed between etching through the second layer of inorganic material and etching through the first layer of inorganic material, the fourth layer of inorganic material is etched in an etch process wherein the fourth inorganic material is selectively etched with respect to the third inorganic material, the second mask layer of resist is removed between etching through the fourth layer of inorganic material and etching through the third layer of inorganic material, etching through the second layer of organic-containing material at the location of the second openings and etching through the first layer of organic-containing material at the location of the first openings take place simultaneously.

A resist mainly contains organic material and it has been found that etch processes for removing resist also etch away organic-containing materials. In each of the two sequences of process steps mentioned in the above described embodiment of the known method, a mask layer of resist is applied for defining the location of the via. During the removal of the mask layer of resist, the layer of organic-containing material to which the via is finally transferred is exposed. Hence, the resist and the organic-containing material are etched at the same time. During this etch process, a transition occurs from etching resist to etching no resist when the resist has been completely removed. This transition causes a considerable change of the etch conditions, thereby adversely affecting the critical dimension control of the etch process. In the method according to the invention, which also includes two sequences of process steps, etching of the first layer of organic-containing material is postponed until the second layer of organic-containing material is etched. In each sequence of process steps, a layer of organic-containing materials applied and this layer is provided with a bottom layer of inorganic material, which in turn is covered with a top layer of inorganic material and a mask layer of resist. By using the method according to the invention the layer of organic-containing material is not exposed during the removal of the mask layer of resist. Because the top layer of inorganic material is etched in an etch process wherein the top inorganic material is selectively etched with respect to the bottom inorganic material, the bottom layer of inorganic material is kept in place without the timing of the etch process for the top layer of inorganic material being critical. Consequently, the mask layer of resist is removed without affecting the layer of organic-containing material. After the removal of the mask layer of resist, the bottom layer of inorganic material is etched by using the top layer of inorganic material as a mask. Finally, after passing through both sequences of process steps, the second and the first layer of organic-containing material are etched in one step. During this last etch step, no transition from etching resist to etching no resist occurs. In comparison with the known method, the method in accordance with the invention therefore results in better defined dimensions of the structure etched in the first and the second layer of organic-containing material.

An embodiment of the method according to the invention is characterized in that the first and the second mask layer of resist are removed with an isotropic etch. Due to the measures in accordance with the invention, the layer of organic-containing material is completely covered with the bottom layer of inorganic material during the removal of the mask layer of resist. As a result, the mask layer of resist can be removed with an isotropic etch, for example in an oxygen plasma, without any etching of the layer of organic-containing material. Because the resist is very reliably removed by means of isotropic etching, the yield of this embodiment of the method according to the invention can be very high.

An embodiment of the method according to the invention is characterized in that a dielectric material having a low dielectric constant is used as the organic-containing material. In order to decrease the capacitive coupling between conductors in a semiconductor device, it is advantageous to use a dielectric material with a low dielectric constant.

An embodiment of the method according to the invention is characterized in that the third layer of inorganic material is etched in an etch process wherein the third inorganic material is selectively etched with respect to the fourth inorganic material. In that case the fourth layer of inorganic material can be made relatively thin compared to the third layer of inorganic material. The application of a relatively thin fourth layer of inorganic material as a mask during etching through the underlying third layer of inorganic material results in an improved dimension control of this etch process. Moreover, the process time required for the deposition of the fourth layer of inorganic material and, later on, for its removal is reduced.

An embodiment of the method according to the invention is characterized in that the first layer of inorganic material is etched in an etch process wherein the first inorganic material is selectively etched with respect to the second inorganic material. In that case the second layer of inorganic material can be made relatively thin compared to the first layer of inorganic material. The application of a relatively thin second layer of inorganic material as a mask during etching through the underlying first layer of inorganic material results in an improved dimension control of this etch process. Furthermore, the presence of a relatively thin second layer of inorganic material between a first and a second layer of organic-containing material with a lower dielectric constant, does not significantly increase the overall dielectric constant and, hence, the capacitive coupling between conductors in a semiconductor device. Moreover, the process time required for the deposition of the second layer of inorganic material and, later on, for its possible removal is reduced.

An embodiment of the method according to the invention is characterized in that the second layer of inorganic material is removed prior to applying the second layer of organic-containing material. In order to decrease the overall dielectric constant and, hence, the capacitive coupling between conductors in a semiconductor device it is advantageous to remove the second layer of inorganic material prior to applying the second layer of organic-containing material with a lower dielectric constant.

An embodiment of the method according to the invention is characterized in that the first layer of inorganic material is applied substantially thinner than the first and second layer of organic-containing material. In this way the contribution of the first layer of inorganic material to the overall dielectric constant and, hence, to the capacitive coupling between conductors in a semiconductor device can be kept as small as possible.

An embodiment of the method according to the invention is characterized in that the fourth layer of inorganic material is removed prior to etching through the second and the first layer of organic-containing material. In case the fourth layer of inorganic material is removed before a structure is formed in the second and the first layer of organic-containing material, the bottom of the structure is still covered with the organic-containing material during the removal of this layer of inorganic material. In this way contamination of the bottom of the structure during the removal of this layer of inorganic material is counteracted, thereby leading to a rather low contact resistance at the bottom of the structure.

An embodiment of the method according to the invention is characterized in that during etching through the first and the second layer of organic-containing material, structures are formed, each one of said structures comprising a first sub-structure in the first layer of organic-containing material and a second sub-structure in the second layer of organic-containing material, the first sub-structure being either a via or a trench, that the first and the second sub-structure are simultaneously filled with a conductive material, which also overlies the second sub-structure, and that the conductive material overlying the second sub-structure is removed. This embodiment has the advantage that the conductive structures, which each comprise a plug combined with either a conductor or another plug on top of it, can be formed with a high density. If the first sub-structure is a plug and the second sub-structure a conductor the method is known as the "dual-damascene process". The method applied to make two super as a modified form of the "dual-damascene process".

An embodiment of the method according to the invention is characterized in that either the third layer of inorganic material or both the fourth and the third layer of inorganic material is removed after the removal of the conductive material overlying the second sub-structure. Since contact between the conductive material inside the structures and the bottom of the structures is brought about prior to the removal of either the third layer of inorganic material or both the fourth and the third layer of inorganic material, contamination of the bottom of the structures during the removal of the above-mentioned layer or layers of inorganic material is counteracted.

An embodiment of the method according to the invention is characterized in that the conductive material overlying the second sub-structure and either the third layer of inorganic material or both the third and the fourth layer of inorganic material are removed by chemical-mechanical polishing. In that case only one process step is required for the removal of the conductive material overlying the second sub-structure and the above-mentioned layer or layers of inorganic material. Moreover, it has been found that an organic-containing material is removed at a much lower rate during chemical-mechanical polishing than conductive and inorganic materials. Hence, the second layer of organic-containing material can serve as a stop layer in the chemical-mechanical polishing operation.

An embodiment of the method according to the invention is characterized in that the first and the third layer of inorganic material are made of the same material, and that the second and the fourth layer of inorganic material are made of the same material. In this way the total number of different process steps required for the manufacture of the electronic device is reduced.

The method in accordance with the invention is also very suitable for patterning an organic-containing material with electroluminescent properties such as, for example, poly-(2-methoxy-5-(3,7-dimethyloctyloxy)-1,4-chloromethylbenzene).

BRIEF DESCRIPTION OF THE DRAWING

These and other aspects of the invention will be apparent from and elucidated with reference to the embodiments described hereafter. In the drawing.

DESCRIPTION OF THE PREFERRED EMBODIMENTS

FIGS. 1 to 13 represent diagrammatic cross-sections of a number of intermediate steps in the manufacture of a first embodiment of an electronic device comprising two layers of organic-containing material, using the method according to the invention.

Figure 1:
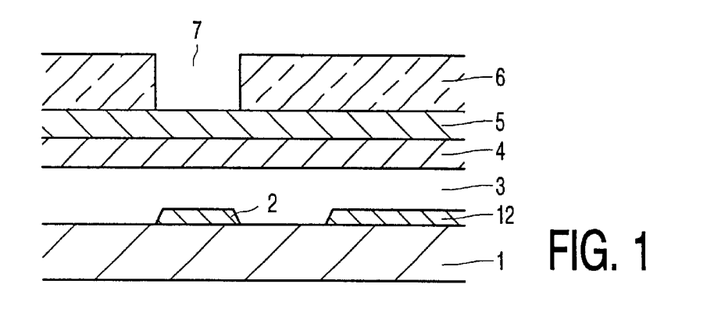
FIGS. 1 to 13 show in diagrammatic cross-sectional views a number of intermediate steps in the manufacture of a first embodiment of an electronic device comprising two layers of organic-containing material, using the method according to the invention.

With reference to FIG. 1, a silicon substrate 1 covered with silicon oxide is provided with a first layer 3 of organic-containing material by means of spin-coating. In this example, the organic-containing material is a material with a low dielectric constant named "SILK©" which is marketed by Dow Chemical of Midland, Mich., USA. A pattern of conductors 2 and 12 may be present on the substrate 1 and these conductors 2 and 12 may be connected to a semiconductor device formed in the substrate 1. The first organic-containing layer 3 of SILK is covered with a first layer 4 of inorganic material, in this example silicon oxide which is applied by means of PE-CVD at low temperatures, i.e. <450 degrees Celsius, or by means of PVD. Optionally, the first organic-containing layer 3 of SILK is provided with an adhesion layer (not shown) before the first inorganic layer 4 of silicon oxide is applied. Then the first inorganic layer 4 of silicon oxide is covered with a second layer 5 of inorganic material, in this example silicon nitride which is applied by means of PE-CVD at low temperatures, i.e. <450 degrees Celsius, or by means of PVD. The materials of the first inorganic layer 4 and the second inorganic layer 5 are different in order to etch these layers selectively with respect to each other. Finally, a first mask layer 6 of resist having first openings 7 is applied to the second inorganic layer 5 of silicon nitride using known techniques.

Figure 2:
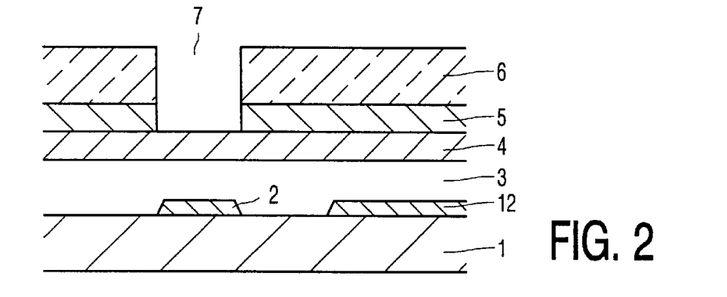

The situation shown in FIG. 2 is obtained after etching through the second inorganic layer 5 of silicon nitride at the location of the first openings 7, with an etch process wherein silicon nitride is selectively etched with respect to silicon oxide, for example an anisotropic etch using $CH_3F$ gas. As a result, the second inorganic layer 5 of silicon nitride can be locally removed while the first inorganic layer 4 of silicon oxide acts as a stop layer, so that the timing of the etch process is no longer critical. In this way the first inorganic layer 4 of silicon oxide can be applied relatively thin. Preferably, the first inorganic layer 4 of silicon oxide is applied substantially thinner than the first organic-containing layer 3 of SILK and a second organic-containing layer 13 of SILK to be applied later on. The thickness of the first inorganic layer 4 of silicon oxide preferably is in the range between 10 and 50 nm, whereas the total thickness of the first and the second organic-containing layer 3 and 13 of SILK is in the range between about 0.5 and 2 $\mu$m.

Figure 3:
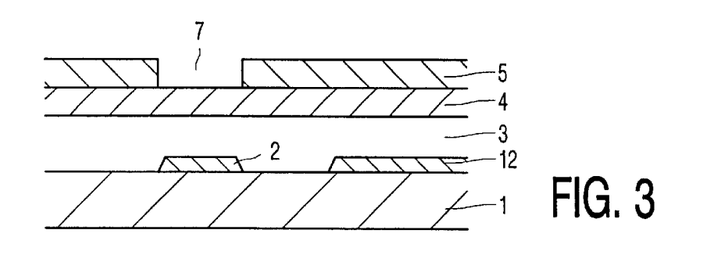

With reference to FIG. 3, the first mask layer 6 of resist is removed in an etch process wherein the resist is selectively etched with respect to silicon nitride and silicon oxide, for example an isotropic etch with oxygen-based chemistries. As a result, the first mask layer 6 of resist can be removed without the timing being critical, because the first inorganic layer 4 of silicon oxide and the second inorganic layer 5 of silicon nitride are hardly affected.

Figure 4:
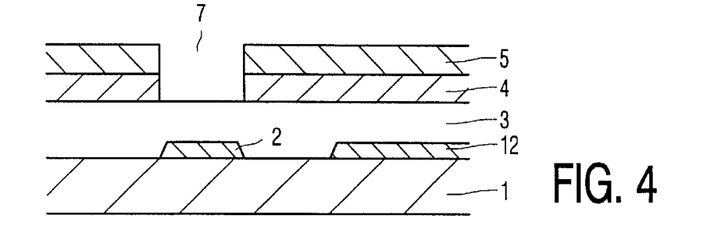

The situation shown in FIG. 4 is obtained after etching through the first inorganic layer 4 of silicon oxide at the location of the first openings 7, using an etch process wherein silicon oxide is selectively etched with respect to silicon nitride, for example an anisotropic etch with a $CO/C_4F_8$ gas mixture. As a result, the first inorganic layer 4 of silicon oxide can be locally removed while the second inorganic layer 5 of silicon nitride serves as a mask. In that case the second inorganic layer 5 of silicon nitride can be made relatively thin compared to the first inorganic layer 4 of silicon oxide. It is noted, however, that it is not necessary to etch the first inorganic layer 4 of silicon oxide selectively with respect to the second inorganic layer 5 of silicon nitride, since the latter inorganic layer can be applied in a thickness which is sufficiently large to withstand etching through the former inorganic layer.

Figure 5:
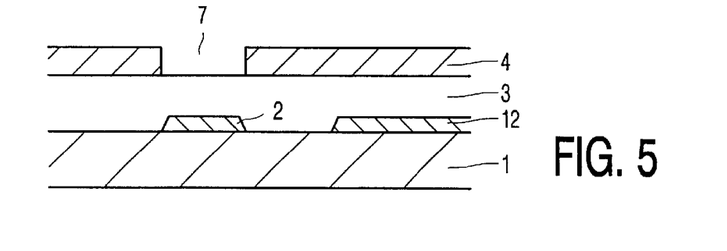

With reference to FIG. 5, the second inorganic layer 5 of silicon nitride is removed in a process wherein the above-mentioned layer is selectively removed with respect to the first inorganic layer 4 of silicon oxide, for example through etching with phosphoric acid. As a result, the second inorganic layer 5 of silicon nitride can be removed without the timing being critical, because the first inorganic layer 4 of silicon oxide acts as a stop layer.

Figure 6:
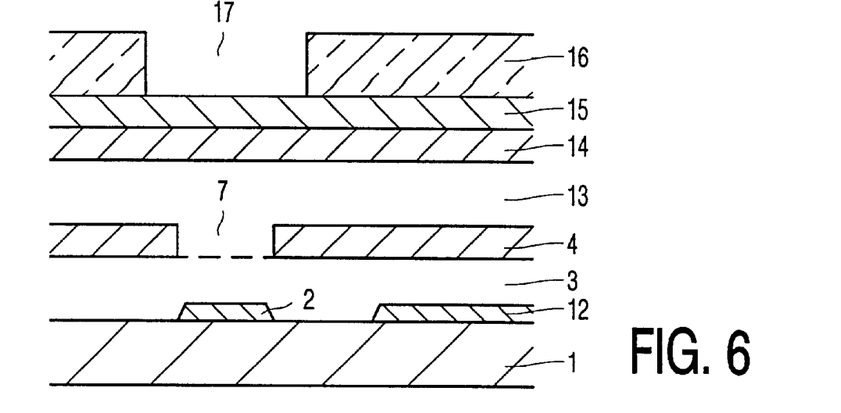

As shown in FIG. 6, a second layer 13 of organic-containing material, in this example SILK, is applied to the exposed surfaces of the first inorganic layer 4 of silicon oxide and the first organic-containing layer 3 of SILK. The second organic-containing layer 13 of SILK is subsequently provided with a third layer 14 of inorganic material, in this example silicon oxide, which in turn is covered with a fourth layer 15 of inorganic material, in this example silicon nitride. Optionally, the second organic-containing layer 13 of SILK is provided with an adhesion layer (not shown) before the third inorganic layer 14 of silicon oxide is applied. The materials of the third inorganic layer 14 and the fourth inorganic layer 15 are different in order to etch these layers selectively with respect to each other. The methods used for depositing the second organic-containing layer 13 of SILK, the third inorganic layer 14 of silicon oxide and the fourth inorganic layer 15 of silicon nitride are the same as those mentioned with reference to FIG. 1. Finally, a second mask layer 16 of resist having second openings 17 is applied to the fourth inorganic layer 15 of silicon nitride using known techniques.

Figure 7:
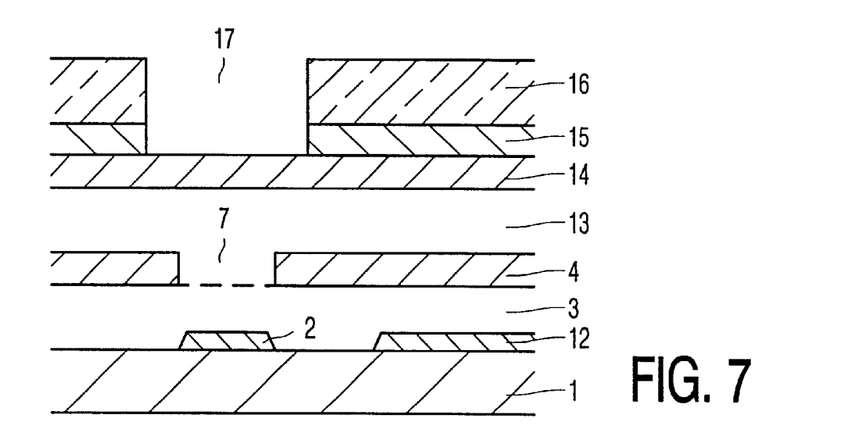

The situation shown in FIG. 7 is obtained after etching through the fourth inorganic layer 15 of silicon nitride at the location of the second openings 17, using an etch process wherein silicon nitride is selectively etched with respect to silicon oxide, for example an anisotropic etch using $CH_3F$ gas. As a result, the fourth inorganic layer 15 of silicon nitride can be locally removed while the third inorganic layer 14 of silicon oxide acts as a stop layer, so that the timing of the etch process is no longer critical. In this way the third inorganic layer 14 of silicon oxide can be applied relatively thin.

Figure 8:
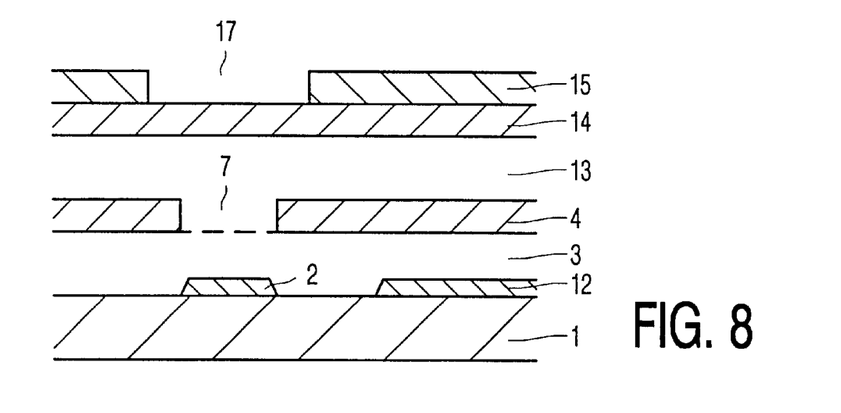

With reference to FIG. 8, the second mask layer 16 of resist is removed in an etch process wherein the resist is selectively etched with respect to silicon nitride and silicon oxide, for example an isotropic etch with oxygen-based chemistries. As a result, the second mask layer 16 of resist can be removed without the timing being critical, because the third inorganic layer 14 of silicon oxide and the fourth inorganic layer 15 of silicon nitride are hardly affected.

Figure 9:
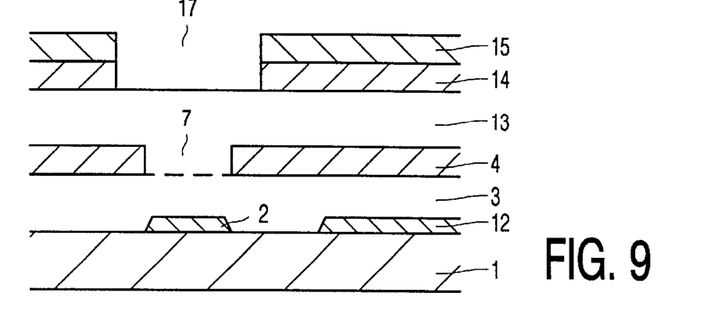

The situation shown in FIG. 9 is obtained after etching through the third inorganic layer 14 of silicon oxide at the location of the second openings 17, using an etch process wherein silicon oxide is selectively etched with respect to silicon nitride, for example an anisotropic etch with a $CO/C_4F_8$ gas mixture. As a result, the third inorganic layer 14 of silicon oxide can be locally removed while the fourth inorganic layer 15 of silicon nitride serves as a mask. In that case the fourth inorganic layer 15 of silicon nitride can be made relatively thin compared to the third inorganic layer 14 of silicon oxide. It is noted, however, that it is not necessary to etch the third inorganic layer 14 of silicon oxide selectively with respect to the fourth inorganic layer 15 of silicon nitride, since the latter inorganic layer can be applied in a thickness which is sufficiently large to withstand etching through the former inorganic layer.

Figure 10:
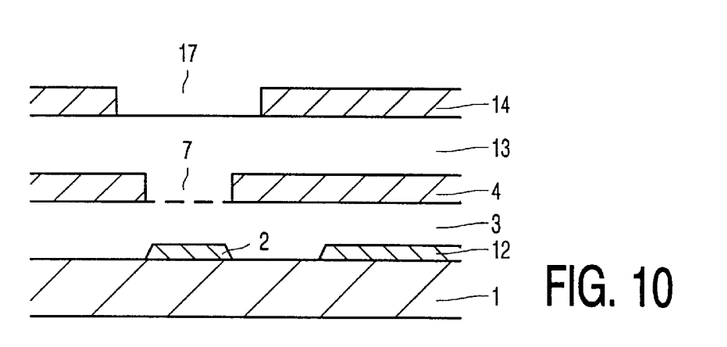

With reference to FIG. 10, the fourth inorganic layer 15 of silicon nitride is removed using a process wherein the above-mentioned layer is selectively removed with respect to the third inorganic layer 14 of silicon oxide, for example through etching with phosphoric acid. As a result, the fourth inorganic layer 15 of silicon nitride can be removed without the timing being critical, because the third inorganic layer 14 of silicon oxide acts as a stop layer.

Figure 11:
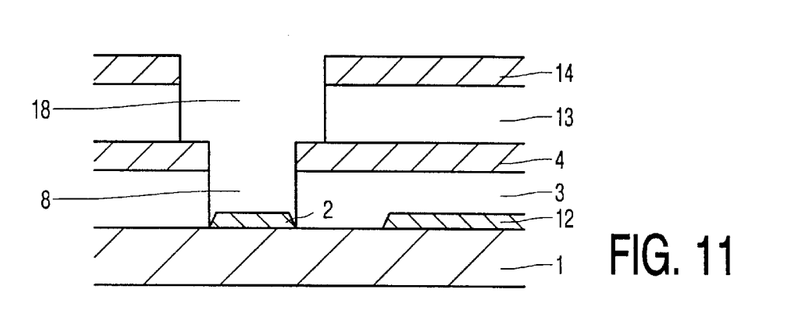

The situation shown in FIG. 11 is obtained after simultaneously etching through the second organic-containing layer 13 of SILK at the location of the second openings 17 and the first organic-containing layer 3 of SILK at the location of the first openings 7 using an etch process wherein SILK is selectively etched with respect to silicon oxide, for example an $HBr/O_2$ etch. In this way, a structure is formed comprising a first sub-structure 8 in the first organic-containing layer 3 of SILK and a second sub-structure 18 in the second organic-containing layer 13 of SILK, the first sub-structure 8 being a via and second sub-structure 18 being either a via or a trench.

Figure 12:
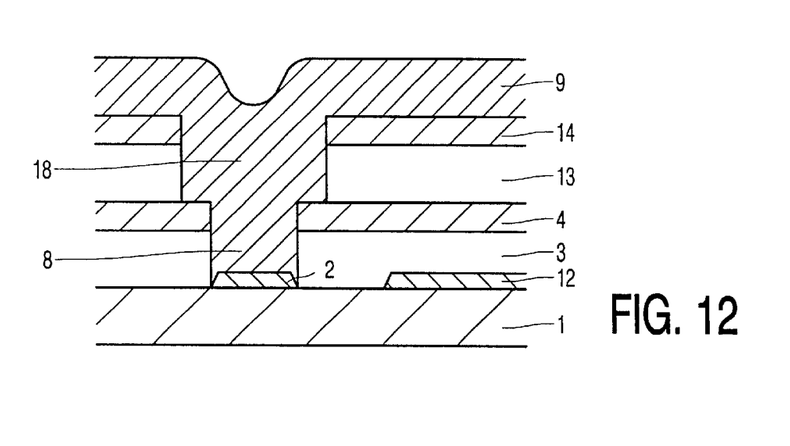

With reference to FIG. 12 the first and the second sub-structure 8 and 18 are filled with a conductive material 9, for example aluminium or copper, which also overlies the second sub-structure 18 and the third inorganic layer 14 of silicon oxide. The conductive material 9 is deposited by means of electroplating, PVD or CVD.

Figure 13:
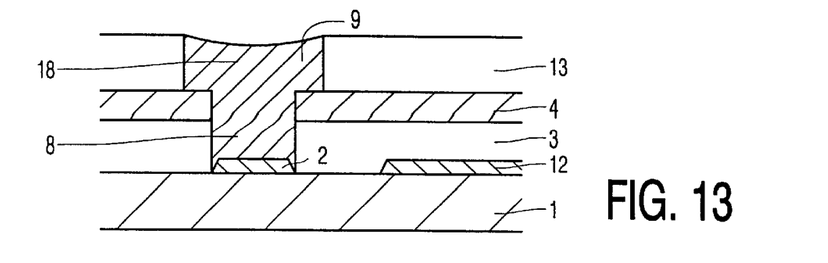

The situation shown in FIG. 13 is obtained by removing the overlying conductive material 9 and the third inorganic layer 14 of silicon oxide until the second organic-containing layer 13 of SILK is exposed. This can be carried out, for example, by chemical-mechanical polishing with a slurry such as SS-EP-A-5600 which is marketed by Cabot, 5080 Robert J. Mathews Parkway, El Dorado Hills, USA. In this way a conductive structure, comprising a plug combined with either a conductor or another plug on top of it, is formed. If that the first sub-structure is a plug and the second sub-structure a conductor, the method is known as the "dual-damascene process". The method applied to make two superimposed plugs can be considered as a modified form of the "dual-damascene process".

The application of a "damascene process" in general enables a high density of conductive structures.

Figure 14:
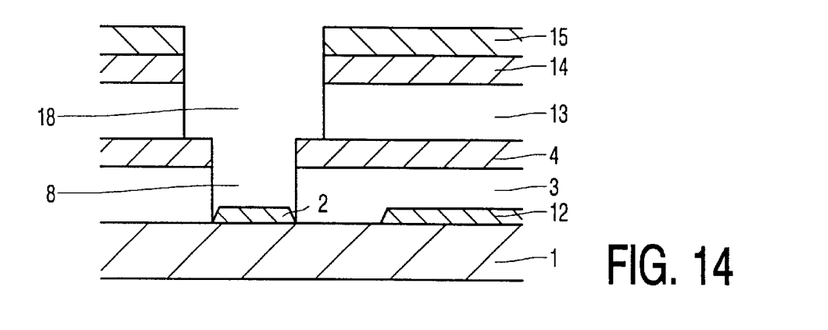
FIGS. 14 and 15 show in diagrammatic cross-sectional views two intermediate steps in the manufacture of a second embodiment of an electronic device comprising two layers of organic-containing material, using the method according to the invention.
Figure 15:
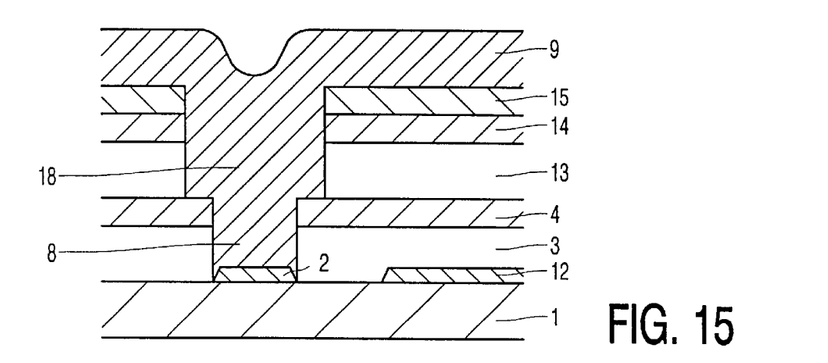

FIGS. 14 and 15 represent diagrammatic cross-sections of two intermediate steps in the manufacture of a second embodiment of an electronic device comprising two layers of organic-containing material, using the method of manufacturing according to the invention. In this second embodiment, the fourth inorganic layer 15 of silicon nitride is not removed prior to filling the first and the second sub-structure 8 and 18 with a conductive material 9, which also overlies the second sub-structure 18 and the fourth inorganic layer 15 of silicon nitride.

Starting from the situation in FIG. 9, the situation in FIG. 14 is obtained after simultaneously etching through the second organic-containing layer 13 of SILK at the location of the second openings 17 and the first organic-containing layer 3 of SILK at the location of the first openings 7, using an etch process wherein SILK is selectively etched with respect to silicon nitride, for example an $HBr/O_2$ or $SO_2/O_2$ etch.

With reference to FIG. 15, the first and the second sub-structure 8 and 18 are filled with a conductive material 9, for example aluminium or copper, which also overlies the second sub-structure 18 and the fourth inorganic layer 15 of silicon nitride, by means of electroplating, PVD or CVD. Subsequently, the overlying conductive material 9, the fourth inorganic layer 15 of silicon nitride and the third inorganic layer 14 of silicon oxide are removed until the second organic-containing layer 13 of SILK is exposed. This can for example be carried out by chemical-mechanical polishing with a slurry such as SS-EP-A-5600, mentioned with reference to FIG. 13 wherein the resulting situation is shown.

FIGS. 16 to 21 represent diagrammatic cross-sections of a number of intermediate steps in the manufacture of a third embodiment of an electronic device comprising two layers of organic-containing material, using the method according to the invention. In this third embodiment, the second inorganic layer 5 of silicon nitride is not removed prior to applying the second organic-containing layer 13 of SILK.

Figure 16:
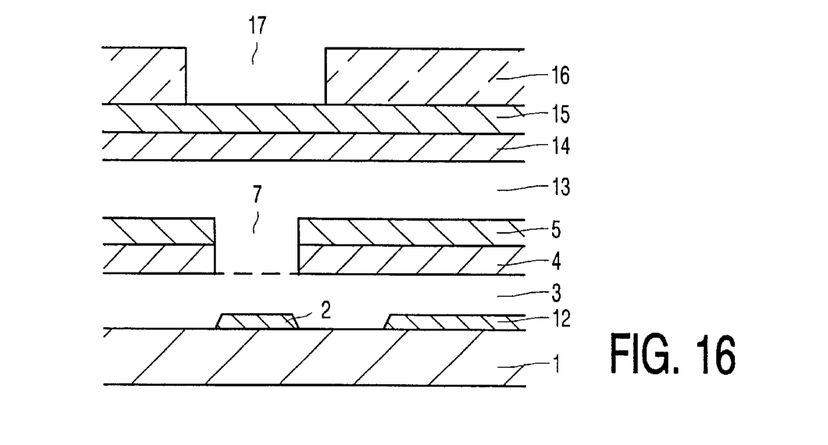
FIGS. 16 to 21 show in diagrammatic cross-sectional views a number of intermediate steps in the manufacture of a third embodiment of an electronic device comprising two layers of organic-containing material, using the method according to the invention.

Starting from the situation in FIG. 4, the situation in FIG. 16 is obtained after first applying a second organic-containing layer 13 of SILK to the exposed surfaces of the second inorganic layer 4 of silicon nitride and the first organic-containing layer 3 of SILK. Then the second organic-containing layer 13 of SILK is provided with a third inorganic layer 14 of silicon oxide, which in turn is covered with a fourth inorganic layer 15 of silicon nitride. Optionally, the second organic-containing layer 13 of SILK is provided with an adhesive layer (not shown) before the third inorganic layer 14 of silicon oxide is applied. The materials of the third inorganic layer 14 and the fourth inorganic layer 15 are different in order to etch these layers selectively with respect to each other. The methods used for depositing the second organic-containing layer 13 of SILK, the third inorganic layer 14 of silicon oxide and the fourth inorganic layer 15 of silicon nitride are the same as those mentioned with reference to FIG. 1. Finally, a second mask layer 16 of resist having second openings 17 is applied to the fourth inorganic layer 15 of silicon nitride using known techniques.

Figure 17:
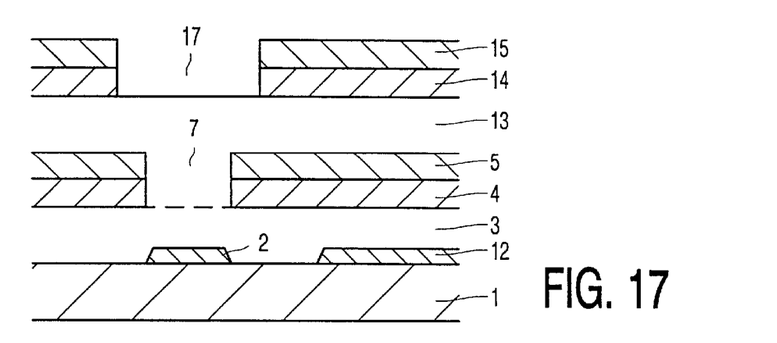

With reference to FIG. 17, first the fourth inorganic layer 15 of silicon nitride is etched through at the location of the second openings 17, using an etch process wherein silicon nitride is selectively etched with respect to silicon oxide, for example an anisotropic etch using $CH_3F$ gas. As a result, the fourth inorganic layer 15 of silicon nitride can be locally removed while the third inorganic layer 14 of silicon oxide acts as a stop layer, so that the timing of the etch process is no longer critical. In this way the third inorganic layer 14 of silicon oxide can be applied relatively thin. Then the second mask layer 16 of resist is removed in an etch process wherein the resist is selectively etched with respect to silicon nitride and silicon oxide, for example an isotropic etch with oxygen-based chemistries. As a result, the second mask layer 16 of resist can be removed without the timing being critical, because the third inorganic layer 14 of silicon oxide and the fourth inorganic layer 15 of silicon nitride are hardly affected. Finally, the third inorganic layer 14 of silicon oxide is etched through at the location of the second openings 17, using an etch process wherein silicon oxide is selectively etched with respect to silicon nitride, for example an anisotropic etch with a $CO/C_4F_8$ gas mixture. As a result, the third inorganic layer 14 of silicon oxide can be locally removed while the fourth inorganic layer 15 of silicon nitride serves as a mask. In that case the fourth inorganic layer 15 of silicon nitride can be made relatively thin compared to the third inorganic layer 14 of silicon oxide. It is noted, however, that it is not necessary to etch the third inorganic layer 14 of silicon oxide selectively with respect to the fourth inorganic layer 15 of silicon nitride, since the latter inorganic layer can be applied in a thickness which is sufficiently large to withstand etching through the former inorganic layer.

Figure 18:
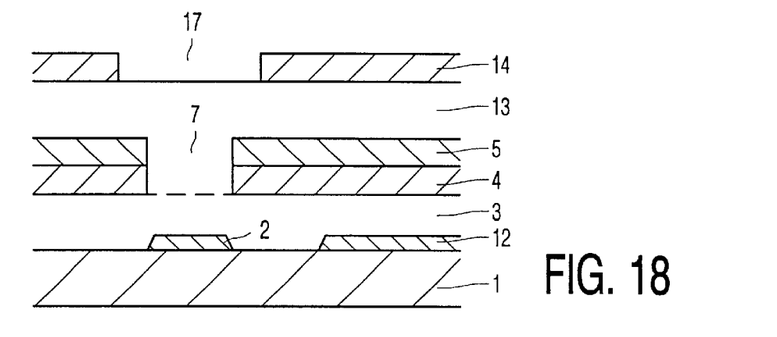

With reference to FIG. 18, the fourth inorganic layer 15 of silicon nitride is removed in a process wherein the above-mentioned layer is selectively removed with respect to the third inorganic layer 14 of silicon oxide, for example through etching with phosphoric acid. As a result, the fourth inorganic layer 15 of silicon nitride can be removed without the timing being critical, because the third inorganic layer 14 of silicon oxide acts as a stop layer.

Figure 19:
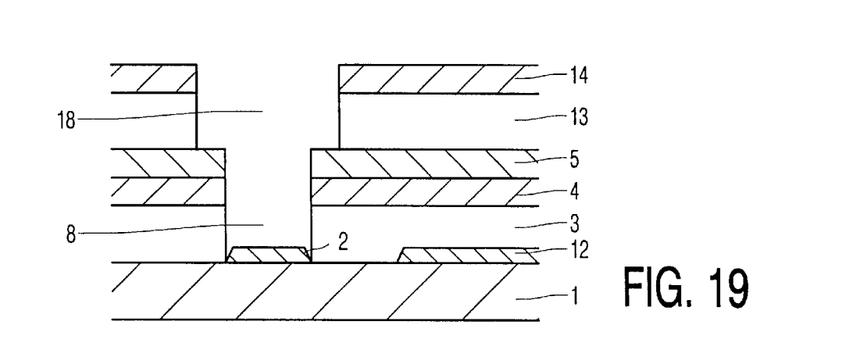

The situation shown in FIG. 19 is obtained after simultaneously etching through the second organic-containing layer 13 of SILK at the location of the second openings 17 and the first organic-containing layer 3 of SILK at the location of the first openings 7, using an etch process wherein SILK is selectively etched with respect to silicon oxide, for example an $HBr/O_2$ etch.

Figure 20:
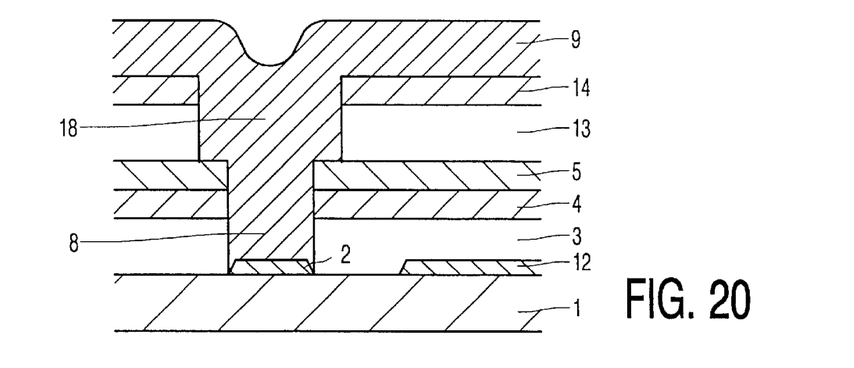
Figure 21:
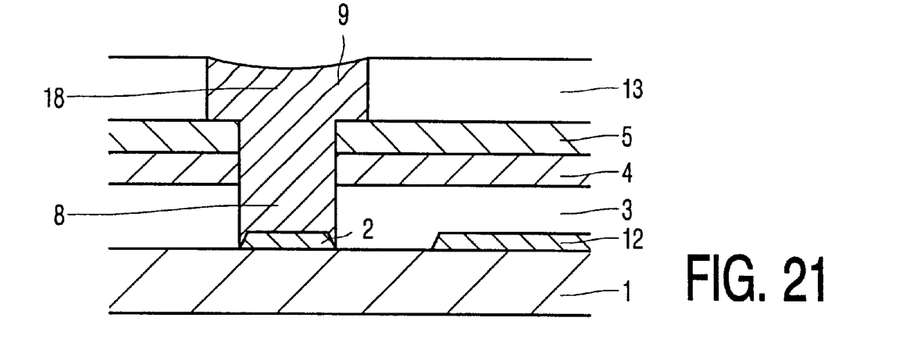

With reference to FIG. 20, the first and the second substructure 8 and 18 are filled with a conductive material 9, for example aluminium or copper, which also overlies the second sub-structure 18 and the third inorganic layer 14 of silicon oxide. The conductive material 9 is deposited by means of electroplating, PVD or CVD The situation in FIG. 21 is obtained after removing the overlying conductive material 9 and the third inorganic layer 14 of silicon oxide by for example chemical-mechanical polishing with a slurry such as SS-EP-A-5600 until the second organic-containing layer 13 of SILK is exposed.

Figure 22:
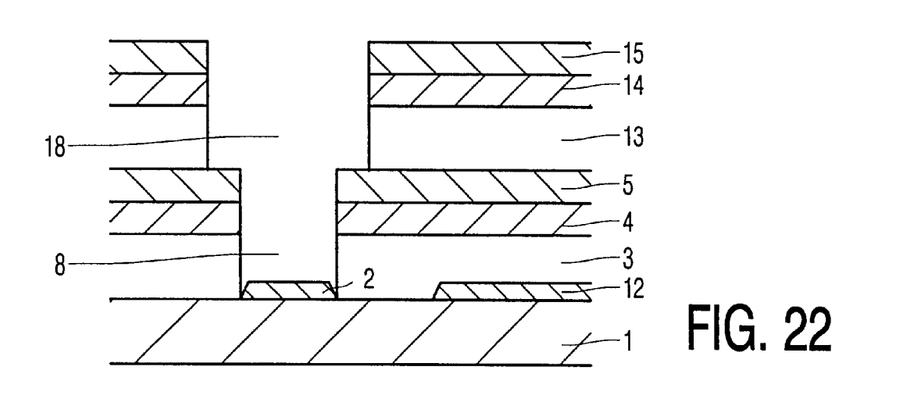
FIGS. 22 and 23 show in diagrammatic cross-sectional views two intermediate steps in manufacture of a fourth embodiment of an electronic device comprising two layers of organic-containing material, using the method according to the invention.
Figure 23:
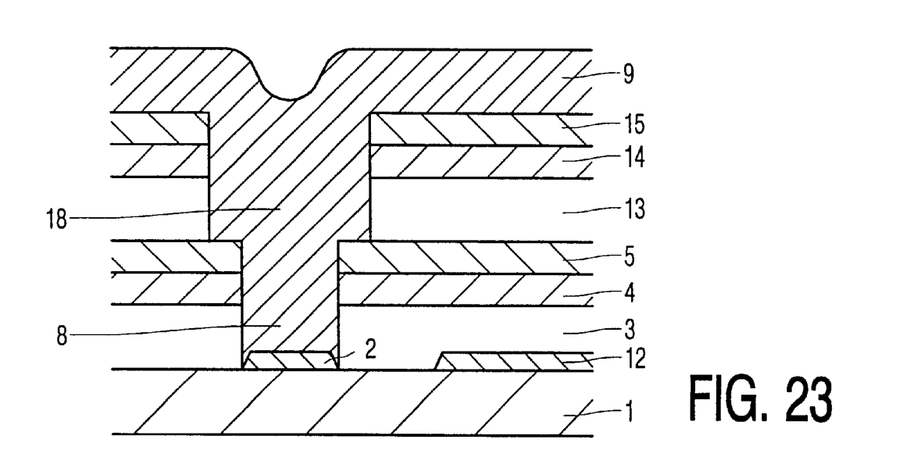

FIGS. 22 and 23 represent diagrammatic cross-sections of two intermediate steps in the manufacture of a fourth embodiment of an electronic device comprising two layers of organic-containing material, using the method according to the invention. In this fourth embodiment the second inorganic layer 5 of silicon nitride is not removed prior to applying the second organic-containing layer 13 of SILK and also the fourth inorganic layer 15 of silicon nitride is not removed prior to filling the first and the second sub-structure 8 and 18 with a conductive material 9, which also overlies the second sub-structure 18 and the fourth inorganic layer 15 of silicon nitride.

Starting from the situation shown in FIG. 17, the situation shown in FIG. 22 is obtained after simultaneously etching through the second organic-containing layer 13 of SILK at the location of the second openings 17 and the first organic-containing layer 3 of SILK at the location of the first openings 7, using an etch process wherein SILK is selectively etched with respect to silicon nitride, for example an $HBr/O_2$ or $SO_2/O_2$ etch.

With reference to FIG. 23, the first and the second sub-structure 8 and 18 are filled with a conductive material 9, for example aluminium or copper, which also overlies the second sub-structure 18 and the fourth inorganic layer 15 of silicon nitride, by means of electroplating, PVD or CVD. Subsequently, the overlying conductive material 9, the fourth inorganic layer 15 of silicon nitride and the third inorganic layer 14 of silicon oxide are removed by for example chemical-mechanical polishing with a slurry such as SS-EP-A-5600 until the second organic-containing layer 13 of SILK is exposed. The resulting situation is shown in FIG. 21.

It is to be noted that the invention is not limited to the embodiments described above. For instance, the third layer of inorganic material or both the fourth and the third layer of inorganic material can be preserved instead of being removed after removal of the overlying conductive material. Furthermore, the resist can be a photoresist, an e-beam resist or a x-ray resist. In addition to SILK©, other organic-containing materials such as Parylene© and Teflon©-like materials can be structured by means of the method according to the invention. In order to adjust the intraline and interline capacitance, different materials can be used for the first and the second layer of organic-containing material. Besides for patterning dielectric organic-containing materials the method is also very suitable for patterning organic-containing materials having electroluminescent properties such as, for example, poly-(2-methoxy-5-(3,7-dimethyloctyloxy)-1,4-chloromethylbenzene).

In the embodiments described above, silicon oxide is used for both the first and the third layer of inorganic material, whereas silicon nitride is used for both the second and the fourth layer of inorganic material. It is certainly not required, however, that a same combination of materials is used for both the first and the second layer of inorganic material and the third and the fourth layer of inorganic material. As illustrated hereafter, a large number of combinations is possible. With respect to the third and the fourth layer of inorganic material, both insulators, semiconductors and metals can be used, provided these materials can be deposited at a temperature below the stability temperature of the organic-containing material applied, which typically ranges from 400 to 450 degrees Celsius. The upper part of the table given below lists pairs of materials to be used for these layers together with appropriate processes for etching them. With respect to the first and the second layer of inorganic material, the situation is different. For the first layer of inorganic material only insulators are applicable, since this layer is not removed prior to applying the second layer of organic-containing material. The type of material to be used for the second layer of inorganic material depends on whether this layer is also removed prior to applying the second layer of organic-containing material or not. Both insulators, metals and semiconductors can be used in the situation that the layer is removed, whereas merely insulators are applicable in case the layer is not removed. The lower part of the same table lists pairs of materials to be used for the first and the second layer of inorganic material together with appropriate etch processes for the situation that the second layer of inorganic material is removed prior to applying the second layer of organic-containing material. It is noted that materials should be selected that can be deposited at a temperature below the stability temperature of the organic-containing material applied, which typically ranges from 400 to 450 degrees Celsius.

TABLE

| Third layer of inorganic material | | Fourth layer of inorganic material | |
|---|---|---|---|
| Material | Etch process | Material | Etch process |
| $SiO_2$ | $CO/C_4F_8$ | SiN | Fluorine-based chemistry, e.g. $CH_3F$ |
| SiN | Fluorine-based chemistry, e.g. $CH_3F$ | $SiO_2$ | $CO/C_4F_8$ |
| $SiO_2$ | Fluorine-based chemistry, e.g. $CF_4$ | TiN | Chlorine-based chemistry, e.g. $Cl_2$ |
| $SiO_2$ | Fluorine-based chemistry | a-Si | Chlorine-based chemistry |
| $SiO_2$ | Fluorine-based chemistry | Ti | Chlorine-based chemistry |
| $SiO_2$ | Fluorine-based chemistry | Al | Chlorine-based chemistry |
| Al | Fluorine-based chemistry | W | Chlorine-based chemistry |
| Al | Chlorine-based chemistry | SiN | Fluorine-based chemistry |
| $SiO_2$ | Fluorine-based chemistry | TaN | Chlorine-based chemistry |
| $SiO_2$ | $CO/C_4F_8$ | SiN | Fluorine-based chemistry, e.g. $CH_3F$ |
| SiN | Fluorine-based chemistry, e.g. $CH_3F$ | $SiO_2$ | $CO/C_4F_8$ |
| $SiO_2$ | Fluorine-based chemistry, e.g. $CF_4$ | TiN | Chlorine-based chemistry, e.g. $Cl_2$ |
| $SiO_2$ | Fluorine-based chemistry | a-Si | Chlorine-based chemistry |
| $SiO_2$ | Fluorine-based chemistry | Ti | Chlorine-based chemistry |
| $SiO_2$ | Fluorine-based chemistry | Al | Chlorine-based chemistry |
| $SiO_2$ | Fluorine-based chemistry | TaN | Chlorine-based chemistry |

What is claimed is:

1. A method of manufacturing an electronic devices comprising two layers of organic-containing material, said method comprising the steps of:

applying a first layer of organic-containing material to a substrate, covering the first layer of organic-containing material with a first layer of inorganic material, applying a second layer of inorganic material which is different from the inorganic material of the first layer, providing a first mask layer of resist having first openings, then etching through the second layer of inorganic-material at the location of the first openings, then etching through the first layer of inorganic material at the location of the first openings, applying a second layer of organic-containing material to the first layer of inorganic material, covering the second layer of organic-containing material with a third layer of inorganic material, applying a fourth layer of inorganic material which is different from the inorganic material of the third layer, providing a second mask layer of resist having second openings, etching through the fourth layer of inorganic material at the location of the second openings, etching through the third layer of inorganic material at the location of the second openings, etching through the second layer of organic-containing material at the location of the second openings, characterized in that the second layer of inorganic material is etched in an etch process wherein the second inorganic material is selectively etched with respect to the first inorganic material, the first mask layer of resist is removed between etching through the second layer of inorganic material and etching through the first layer of inorganic material without affecting the first layer of organic-containing material, the fourth layer of inorganic material is etched in an etch process wherein the fourth inorganic material is selectively etched with respect to the third inorganic material, the second mask layer of resist is removed between etching through the fourth layer of inorganic material and etching through the third layer of inorganic material without affecting the second layer of organic-containing material, etching through the second layer of organic-containing material at the location of the second openings and etching through the first layer of organic-containing material at the location of the first openings take place simultaneously.

2. A method as claimed in claim 1, characterized in that the first and the second mask layer of resist are removed with an isotropic etch.

3. A method as claimed in claim 1, characterized in that a dielectric material having a dielectric constant less than 4 is used as the organic-containing material.

4. A method as claimed in claim 1, characterized in that the third layer of inorganic material is etched in an etch process wherein the third inorganic material is selectively etched with respect to the fourth inorganic material.

5. A method as claimed in claim 1, characterized in that the first layer of inorganic material is etched in an etch process wherein the first inorganic material is selectively etched with respect to the second inorganic material.

6. A method as claimed in claim 1, characterized in that the second layer of inorganic material is removed prior to applying the second layer of organic-containing material.

7. A method as claimed in claim 1, characterized in that the first layer of inorganic material is applied thinner than the first and the second layer of organic-containing material.

8. A method as claimed in claim 1, characterized in that the fourth layer of inorganic material is removed prior to etching through the second and the first layer of organic-containing material.

9. A method as claimed in claim 1, characterized in that during etching through the first and the second layer of organic-containing material, structures are formed, each one of said structures comprising a first sub-structure in the first layer of organic-containing material and a second sub-structure in the second layer of organic-containing material, the first sub-structure being a via and the second sub-structure being either a via or a trench, that the first and the second sub-structure are simultaneously filled with a conductive material, which also overlies the second sub-structure, and that the conductive material overlying the second sub-structure is removed.

10. A method as claimed in claim 9, characterized in that either the third layer of inorganic material or both the fourth and the third layer of inorganic material is removed after the removal of the conductive material overlying the second sub-structure.

11. A method as claimed in claim 10, characterized in that the conductive material overlying the second sub-structure and either the third layer of inorganic material or both the third and the fourth layer of inorganic material are removed by chemical-mechanical polishing.

12. A method as claimed in claim 1, characterized in that the first and the third layer of inorganic material are made of the same material, and that the second and the fourth layer of inorganic material are made of the same material.

13. A method as claimed in claim 1, characterized in that a material having electroluminescent properties is used as the organic-containing material.

* * * * *